(12) United States Patent
Conn

(10) Patent No.: US 6,864,156 B1
(45) Date of Patent: Mar. 8, 2005

(54) SEMICONDUCTOR WAFER WITH WELL CONTACTS ON BACK SIDE

(75) Inventor: Robert O. Conn, Los Gatos, CA (US)

(73) Assignee: Xilinx, Inc., San Jose, CA (US)

(*) Notice: Subject to any disclaimer, the term of this patent is extended or adjusted under 35 U.S.C. 154(b) by 75 days.

(21) Appl. No.: 10/407,514

(22) Filed: Apr. 4, 2003

(51) Int. Cl.[7] .............................................. H01L 21/30
(52) U.S. Cl. ....................... 438/459; 438/153; 438/253
(58) Field of Search ................................ 438/459, 455, 438/153, 154, 195, 253, 228, 302, 57, 197

(56) References Cited

U.S. PATENT DOCUMENTS

| | | | |
|---|---|---|---|
| 5,354,695 A | 10/1994 | Leedy | |
| 5,436,173 A | 7/1995 | Houston | |
| 5,508,219 A | 4/1996 | Bronner et al. | |
| 5,591,678 A | 1/1997 | Bendik et al. | |
| 5,767,549 A | 6/1998 | Chen et al. | |
| 5,985,705 A * | 11/1999 | Seliskar | 438/197 |
| 6,001,667 A * | 12/1999 | Saitoh et al. | 438/57 |
| 6,063,686 A | 5/2000 | Masuda et al. | |
| 6,420,218 B1 | 7/2002 | Yu | |
| 6,518,613 B2 | 2/2003 | Willer et al. | |
| 6,521,947 B1 | 2/2003 | Ajmera et al. | |
| 6,566,713 B2 * | 5/2003 | Nii | 257/347 |
| 6,753,239 B1 * | 6/2004 | Conn | 438/459 |

OTHER PUBLICATIONS

Alex Romanelli, "Intel Stacks Flash Deck in its Favor," Electronic News, Apr. 10, 2003, available from Reed Electronics Group @ http://www.e-insite.net/electronicnews/index.asp?layout=article&articleid=CA291318.

Q.-Y. Tong, "Semiconductor Wafter Bonding: Science And Technology," 1999, pp. 229-231, 235-237 & 284-285, available from John Wiley & Sons, Inc., 605 Third Ave, New York, N.Y. 10158-0012.

* cited by examiner

Primary Examiner—Long Pham
Assistant Examiner—(Vikki) Hoa B. Trinh
(74) Attorney, Agent, or Firm—T. Lesser Wallace; Edel M. Young; Justin Liu

(57) ABSTRACT

A supporting structure is wafer-bonded to the upper face side of a partially or fully processed device wafer. The device wafer includes a transistor having a well region that extends into the substrate material of the device wafer. The source and drain regions of the transistor extend into the well region. After attachment of the supporting structure, the device wafer is thinned from the back side until the bottom of the well region is reached. To reduce source and drain junction capacitances, etching can continue until the source and drain regions are reached. In one embodiment, all of the well-to-substrate junction is removed in a subsequent etching step, thereby reducing or eliminating the well-to-substrate junction capacitance of the resulting transistor. Resistance between the well electrode and the transistor channel is reduced because the well contact is disposed on the back side of the device wafer directly under the gate of the transistor.

14 Claims, 7 Drawing Sheets

SEMICONDUCTOR WAFER WITH WELL CONTACTS ON BACK SIDE

FIELD OF THE INVENTION

The present invention relates to bond and etchback semiconductor-on-insulator (BESOI) semiconductor processing technology and related structures.

BACKGROUND INFORMATION

FIG. 1 (Prior Art) is a cross-sectional diagram of a conventional complementary metal oxide semiconductor (CMOS) transistor structure 1 often used in contemporary ultra large scale integration. The diagram is simplified to better illustrate the related issues. Structure 1 includes a P-channel transistor 2 having a source region 3, a drain region 4 and a gate 5. A channel region exists between source region 3 and drain region 4. Source region 3 and drain region 4 extend into in an N-type well region 6.

The structure also includes an N-channel transistor 7 having a source region 8, a drain region 9 and a gate 10. A channel region exists between source region 8 and drain region 9. Source region 8 and drain region 9 extend into in a P-type well region 11. Well regions 6 and 11 are diffused into a bulk semiconductor substrate 12. Bulk substrate 12 in this case is monocrystalline silicon of a silicon wafer. In this example, well region 11 is reverse biased with respect to substrate 12. Each of the wells and the substrate is provided with a contact so that the wells and substrate can be maintained at the appropriate potentials. Above the upper surface 13 (sometimes called the "face side") of the semiconductor wafer are multiple interleaved layers of metallization and insulation (not shown). The metallization layers interconnect the various transistors to form a desired integrated circuit.

In MOS transistors such as the transistors of FIG. 1, switching speed is limited by the time required to charge and discharge the capacitances between device electrodes. If parasitic capacitances between the device electrodes can be reduced, then device speed can be increased. In each of the two transistors of FIG. 1, there exists a junction capacitance between the source region and the well region, a junction capacitance between the drain region and the well region, and a junction capacitance between the P-well region and the substrate. A process is desired that reduces these capacitances and therefore speeds transistor operation.

In addition to transistors 2 and 7 of FIG. 1 being slowed due to the presence of parasitic junction capacitances, the performance of transistors 2 and 7 also suffers due to a resistance existing between the well contact and the channel of each transistor. Radiation such as alpha particles can be penetrate into the semiconductor material of the transistors. Each alpha particle generates electron-hole pairs along its path as it passes into the semiconductor material of the device. If, for example, the electron-hole pairs are generated in a portion of the semiconductor material in which an electric field is present (for example, due to the reverse bias of a well-to-substrate junction), then the electrons and holes may be separated by the electric field. The resulting current is then typically drawn out of the well region through the well contact. One such alpha particular may, for example, generate one million such electron hole pairs. If the current path of the resulting current passes under the channel on its way from the well-to-substrate junction to the well contact, then a momentary voltage drop will exist across the current path due to the resistance of the well under the channel. This momentary voltage may affect the threshold voltage of the transistor or otherwise affect transistor operation.

In addition to currents flowing past the channel region of a transistor due to alpha particles, the normal switching of the transistors can also cause undesirable currents to flow in the transistor structure of FIG. 1. A first junction capacitance exists between the well region of the N-channel transistor and the substrate. A second junction capacitance exists between the substrate and the well region of the P-channel transistor. These capacitances are oriented in series with one another. Consider the situation in which the drains of the N-channel and P-channel transistors are coupled together to that the transistors form an inverter. As the transistors switch, the voltages on the drains of the transistors change, thereby causing small local changes in the voltages in the well regions. The result is current flow in a current path formed by the series coupled capacitances. This current through the well resistance, like the current due to alpha particles, may cause momentary voltage changes as the current flows through the resistance of the well region underneath a transistor channel. Such voltage fluctuations may adversely affect transistor operation.

These and other problems exist due to resistances and junction capacitances of the structure.

Using silicon-on-insulator (SOI) processing technology, transistors can be fabricated in a thin semiconductor layer that is supported and insulated from an underlying supporting substrate. In one so-called "bond and etchback" SOI (BESOI) device architecture, an insulating layer is formed over a device wafer. Etch stops are formed into the surface of the device wafer. A supporting "handle" wafer is then bonded to the insulating layer of the device wafer, and the back side of the device wafer is thinned in a planar fashion using a thinning technique until the etch stops are reached. Chemical mechanical polishing (CMP) may be used to perform this thinning. The resulting structure is a very thin layer of the device wafer that is insulated from the underlying supporting substrate by the insulating layer. Transistors are then formed into this thin layer of the device wafer. Because the transistors do not have well regions that extend into the underlying supporting substrate, the transistors do not have the associated junction capacitances. Commonly acknowledged advantages of BESOI devices include: 1) less junction capacitance so higher speed can be achieved, 2) reduced susceptibility to problems causes by radiation such as alpha particles, and 3) better isolation between transistors and increased freedom from latchup.

Although such BESOI techniques exist, the transistors nonetheless still suffer from an amount of junction capacitance. Moreover, the resistance of the well material in the area underneath the channel is present. Current through this area can still cause voltages that have undesirable influences on transistor operation. Resistance of the transistors to single event upsets, although improved, still remains. In addition to the well contacts involving a resistance, they also occupy an amount of area on the surface SOI wafer.

An improved processing technology is desired.

SUMMARY

A supporting structure such as a silicon wafer is wafer-bonded to the upper face side of a partially processed or fully processed device wafer. The device wafer includes a field effect MOS transistor. The field effect transistor includes a well region that extends into the substrate material of the device wafer. The source region and drain region of the field effect transistor extend at least partly into the well region.

After attachment of the supporting structure, the device wafer is thinned from the back side of the device wafer until the bottom of the well region is exposed. A well contact region is then ion implanted into the exposed bottom surface of the well region and a metal electrode is formed to make contact to the well region from the back side of the device wafer. The resulting transistor structure has a reduced amount of well-to-substrate parasitic junction capacitance because the well region to substrate junction area that would have otherwise existed on the bottom of the well region has been removed. Resistance between the well contact and the channel region of the transistor is reduced because the well contact is disposed close to the channel region directly under the gate of the transistor.

In another embodiment, the substrate region of a device wafer is thinned from the back side until the bottom of the well region is exposed. All the substrate material disposed underneath the well region is therefore removed. A subsequent etching step is then performed to etch away all remaining portions of the substrate region (for example, between transistors). The result is islands of well material. There is little or no well-to-substrate material interface because all or substantially all of the substrate material is removed. The associated parasitic well-to-substrate junction capacitance is therefore eliminated or reduced. In one embodiment, contact is made to the well regions by metal that extends down from the top of the source regions and across the bottoms of the well regions to well contact regions disposed directly underneath the gates of the transistors on the back side of the device wafer.

In another embodiment, a device wafer is thinned from the back side past the point of exposing the well region of the transistor. Rather, the device wafer is thinned from the back side until the bottoms of the source and drain regions of the transistor are reached. Only a small amount of the well region remains. This amount of well region material is disposed principally between the source region and the drain region. Accordingly, the associated source-to-well and drain-to-well junction capacitances are reduced. Contact is made to the narrow amount of remaining well material between the source region and the drain region by leaving a relatively large contact portion of the well material in contact with the narrow portion of the well material. The remaining well material therefore has a key-shaped structure. The wide part of the key-shaped structure is the contact portion. The narrow portion of the key-shaped structure is the narrow channel portion.

In one embodiment, a metal well electrode in the interconnect portion of the device wafer makes electrical connection with the key-shaped well structure via the contact portion of the key-shaped well region. The contact portion of the key-shaped well region is therefore coupled in a vertical direction to the well electrode in the overlaying interconnect portion of the device wafer.

In another embodiment, metal is deposited and patterned onto the back side of the device wafer to make a well electrode that contacts the remaining well region from the back side of the device wafer. A bias voltage is placed onto this well electrode from a source disposed on the back side of the device wafer, as opposed to being supplied from a well electrode disposed in the interconnect portion of the device wafer. By placing the well electrode on the back side of the device wafer, space on the upper device side of the device wafer that would otherwise be used for the well contact is now usable for other purposes such as, for example, achieving closer component spacing.

In another embodiment, the narrow portion of the key-shaped well structure between the source region and the drain region is thinned from the back side so that it is thinner than the adjacent source and drain regions. After thinning, the source region, drain region and thinned well material are oxidized to form a thin thermal oxide. An area of the thin thermal oxide is then removed to form a second gate contact area. Metal is then deposited on the thin thermal oxide and is patterned to form a second gate electrode. Metal of the second gate electrode makes electrical contact with the electrode of the first gate through the second gate contact region. The resulting double gate transistor structure has substantially no substrate-to-well region junction capacitance because all or substantially all of the substrate-to-well junction has been removed. The resulting double gate transistor has very little source-to-well or drain-to-well junction capacitance because the well has been thinned and patterned such that the only contact between the well material and the source and drain is in the narrow channel region between the source region and the drain region. The threshold voltage of each of the channels of the resulting double gate transistor can be adjusted to improve subthreshold leakage of the double gate transistor.

By eliminating the substrate material altogether, by reducing the size of the drain regions as compared to the source regions, and/or by placing the well electrodes and associated contacts on the back side of the device wafer, less device wafer surface area is required to fabricate the transistors of the present invention as compared to the transistors of the conventional structure of FIG. 1. Closer component spacing is therefore possible without reducing the minimum feature size achievable with the semiconductor fabrication process used and without any reduction in minimum lithography dimensions.

Other structures and methods are described in the detailed description below. This summary does not purport to define the invention. The invention is defined by the claims.

DETAILED DESCRIPTION

Figure 2:
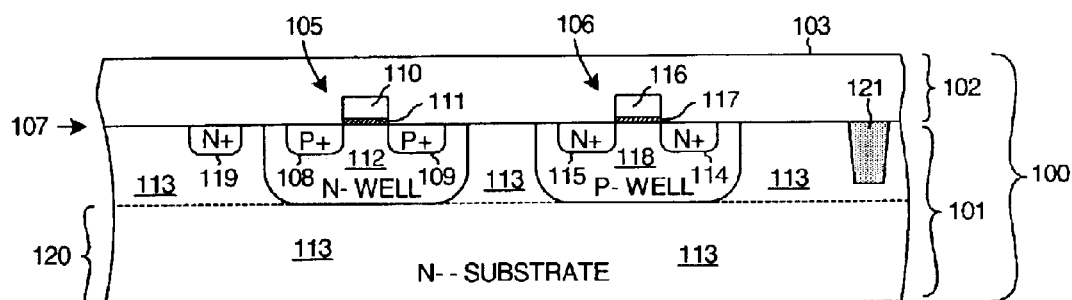
FIG. 2 is a simplified cross-sectional diagram of a device wafer having a polish stop in accordance with a step in a first method.

FIG. 2 is a simplified cross-sectional diagram of a device wafer 100 in an initial step of a first method. Device wafer 100 includes a semiconductor wafer portion 101 and an overlying interconnect portion 102. Device wafer 100 has an upper face side surface 103 and a back side surface 104. Device wafer 100 is, in this example, a wafer of monocrystalline silicon.

A first transistor 105 and a second transistor 106 are formed on and into an upper surface 107 of the semiconductor wafer portion 101 of device wafer 100. First transistor 105 is a P-channel MOS field effect transistor having a P-type source region 108, a P-type drain region 109, and a gate 110. A channel region exists between source region 108 and drain region 109. A thin thermal oxide gate insulating layer 111 separates gate 110 from the underlying channel region. The source and drain regions 108 and 109 are regions of diffusion that extend down into an N-type well region 112. N-type well region 112 is made smaller in the lateral dimensions than the N-well region of the conventional structure of FIG. 1 because no well contact and well electrode is provided on the upper surface 107. The area on upper surface 107 that would otherwise have been consumed by a well contact and well electrode is usable for other purposes. N-type well region 112 extends down into a less heavily doped N-type substrate region 113 of the bulk semiconductor material of device wafer 100.

Second transistor 106 is an N-channel MOS field effect transistor of similar construction to P-channel transistor 105 except that the component regions of N-channel transistor 106 are of opposite conductivity types. The regions that are N-type in transistor 105 are P-type in transistor 106, and regions that are P-type in transistor 105 are N-type in transistor 106.

N-channel transistor 106 has an N-type source region 114, an N-type drain region 115, and a gate 116. A channel region exists between source region 114 and drain region 115. A thin thermal oxide gate insulating layer 117 separates gate 116 from the underlying channel region. The source and drain regions 114 and 115 are regions of diffusion that extend down into a P-type well region 118. P-type well region 118 in turn extends down into the into substrate region 113 of the bulk semiconductor material of device wafer 100. The P-type well region 118 is made smaller than the P-well region of the conventional structure of FIG. 1 because no well contact or well electrode is provided on the upper surface 107. The surface area on upper surface 107 that would otherwise have been consumed by a well contact and well electrode is usable for other purposes such as, for example, placing the transistors 105 and 106 closer together.

A highly doped N+ substrate contact region 119 is provided on upper surface 107. The associated substrate contact electrode is omitted from the diagram. The substrate contact region 119 is used to reverse bias the well regions 112 and 118 with respect to substrate region 113. Substrate region 113 in this case is lightly doped N minus minus (denoted N−−) with respect to the more heavily N minus doped (denoted N−) N-type well region 112. In the structure of FIG. 2, a layer 120 of substrate region 113 is disposed between the bottom extent of the well regions 112 and 118 and back side surface 104 of device wafer 100. Although not illustrated in the diagram, source and drain electrodes are provided to make electrical contact with the source and drain regions of transistors 105 and 106 in conventional fashion.

A polish stop structure 121 (sometimes loosely termed an "etch stops" structure) extends down into device wafer 100 from surface 107 to a predetermined depth. Etch stop 121 may, for example, be formed by reactive ion etching (RIE) a hole or trench of a predetermined depth and then filling the hole or trench with metal or an oxide. The depth of the polish stop is deeper than the bottom extent of the source and drain regions 108, 109, 115 and 114 of transistors 105 and 106 but is shallower than the bottom extent of well regions 112 and 118.

Device wafer 100 is a partially processed or fully processed wafer in that the many transistors of the wafer are interconnected in a desired manner by interleaved layers of metal and insulation (not shown). These metal and insulator layers are disposed in region 102 above upper surface 107. Surface 103 represents the upper surface of the partially processed or fully processed device wafer. Upper surface 103 may, for example, be the upper surface of a smooth planarized layer of deposited oxide. The deposited oxide may, for example, be TEOS (tetraethoxysilane) or BPSP (borophospho-silicate glass) that is deposited and then planarized by chemical mechanical polishing. Care is taken to ensure that the upper surface 103 of this planarized layer is parallel with respect to the upper surface 107 of semiconductor wafer portion 101.

Figure 3:
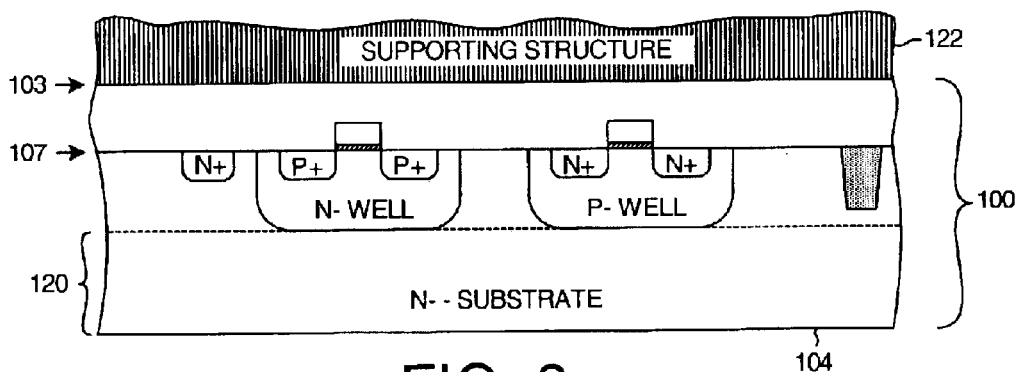
FIG. 3 is a simplified cross-sectional diagram of the device wafer of FIG. 2 after a supporting structure has been wafer-bonded to the face side surface of the device wafer in accordance with the first method.
Figure 4:
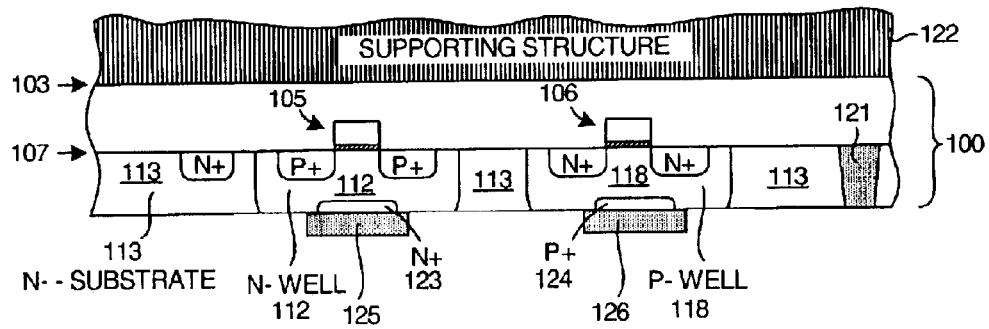
FIG. 4 is a simplified cross-sectional diagram of a subsequent step wherein the back side of the device wafer is thinned to remove a layer of substrate material and to expose a bottom portion of well regions in accordance with the first method.

FIG. 3 shows a subsequent step in accordance with the first method. A supporting structure 122 is attached to upper surface 103 of device wafer 100. Supporting structure 122 may, for example, be a silicon wafer (sometimes called a "handle" wafer) that is covalently bonded to device wafer 100 using conventional wafer-bonding techniques. Alternatively, a large number of small non-oxidized aluminum posts can be provided both on the upper surface 103 of device wafer 100 as well as on the bottom surface of supporting structure 122. Each of the aluminum posts on device wafer 100 contacts a corresponding one of the aluminum posts on supporting structure 122 when the device wafer and the supporting structure are brought together so that the posts of each each pair of contacting posts cold welds together and thereby bond supporting structure 122 to device wafer 100. For additional details on a technique for bonding a supporting structure to a device wafer using aluminum posts, see: U.S. patent application Ser. No. 10/405,789, entitled "Stacked Die Bonded To Aluminum Posts", by Robert O. Conn, filed Apr. 1, 2003, the subject matter of which is incorporated herein by reference. Other suitable wafer bonding techniques can also be used to attach supporting structure 122 to device wafer 100.

Next, device wafer 100 is thinned from its back side surface 104 so that layer 120 of the substrate semiconductor material is removed. Removing layer 120 results in a portion of well region 112 and a portion of well region 118 being exposed. In the present embodiment, layer 120 is removed by chemical mechanical polishing (CMP) the back side of the device wafer 100 until etch stop 121 is reached. An optional plasma etch is then performed to further smooth the ground down back side surface. The resulting thinned device wafer 100 may, for example, be approximately 20 microns thick. Well regions 112 and 118 appear as islands surrounded by N-type substrate material 113 when the thinned device wafer 100 is viewed from back side surface 104.

Next, well contact diffusion regions 123 and 124 are ion implanted into well regions 112 and 118, respectively, from the back side of device wafer 100. The dopants in the well contact regions are activated. Metal is deposited onto the back side surface of device wafer 100 and is patterned to form metal well contact electrodes 125 and 126.

In one embodiment, the distance between the source and drain regions is approximately 0.1 microns, the depth of the source region and the drain region is approximately 0.5 microns, the depth of the well regions after thinning is approximately one micron, and the distance in the vertical dimension between the top of well contact region and the bottom the source and drain regions is slightly less than one micron.

Figure 1:
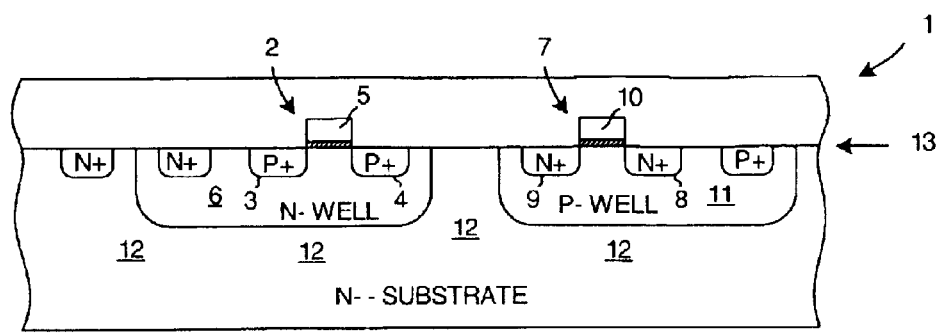
FIG. 1 (Prior Art) is a simplified cross-sectional diagram of a conventional CMOS field effect transistor structure.

Parasitic junction capacitances between well region 112 and substrate region 113 and between well region 118 and substrate region 113 are reduced in comparison to the structure of FIG. 1 because the bottoms of the well regions are no longer in contact with substrate material. The attendant semiconductor junction is therefore no longer present.

After the well contact regions 123 and 124 and well electrodes 125 and 126 are fabricated, the bonded supporting structure and device wafer assembly is diced into individual integrated circuit dice. The supporting structure portion of each integrated circuit die supports its associated 20 micron thin portion of the device wafer.

A plurality of P-channel transistors can be disposed in a row in a single island of well region 112 such that a single strip-shaped well electrode runs underneath the channel regions of all the transistors of the row and makes contact to the well region directly underneath the channel of each P-channel transistor in the row. Similarly, a plurality of N-channel transistors can be disposed in a row in a single island of well region 118 such that a single strip-shaped well electrode runs underneath the channel regions of all the transistors of the row.

In each of transistors 105 and 106, the well contact and well electrode is located directly underneath the channel region. Accordingly, the resistance between the channel region and the well electrode is reduced in comparison to the conventional structure of FIG. 1. Problems encountered in the conventional structure of FIG. 1 due to the well contacts being located farther away from the channel regions are therefore reduced or eliminated. In one embodiment, the resulting integrated circuit die is mounted in an integrated circuit package face down flip-chip style. The back side of the device wafer 100 is left exposed to air in the cavity of the integrated circuit package or is covered with a layer of passivation.

Figure 5:
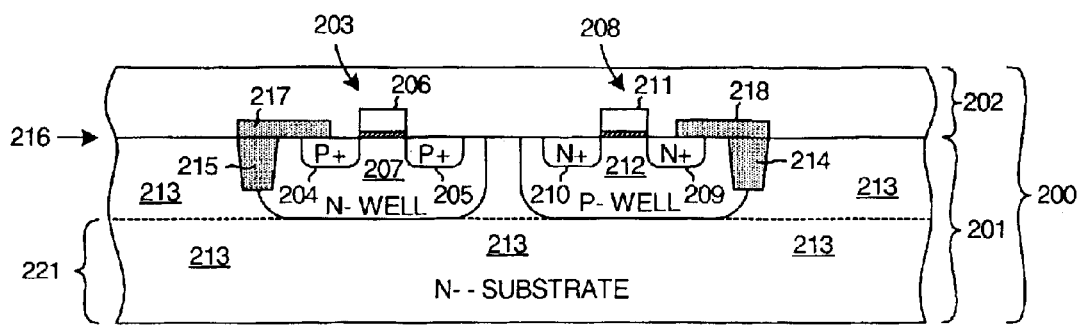
FIG. 5 is a simplified cross-sectional diagram of a device wafer in accordance with a step in a second method.

FIG. 5 is a simplified cross-sectional diagram of a device wafer 200 in an initial step of a second method. As in the case of device wafer 100 of FIG. 2, device wafer 200 of FIG. 5 includes a semiconductor wafer portion 201 and an overlying interconnect portion 202. A P-channel field effect transistor 203 including a P-type source region 204, a P-type drain region 205, and a gate 206 is disposed in an N-type well region 207. Similarly, an N-channel field effect transistor 208 including an N-type source region 209, an N-type drain region 210, and a gate 211 is disposed in an P-type well region 212. The well regions 207 and 212 extend into the bulk lightly doped N-type (N minus minus) semiconductor substrate material 213 of semiconductor wafer portion 201.

Metal polish stop structures 214 and 215 extend down into device wafer 200 from the upper surface 216 of the semiconductor wafer portion 201. The polish stop structures extend past the depth of the source and drain regions of transistors 203 and 208 but do not extend to the depth of well regions 207 and 212. Polish stop structure 215 is coupled to source region 204 of transistor 203 by a portion of metal 217. Polish stop structure 214 is coupled to source region 212 of transistor 208 by a portion of metal 218.

The semiconductor design rules applicable to the particular CMOS process used to fabricate transistors 203 and 208 may require that a certain distance be provided between the edge of a contact to a diffusion region and any adjacent diffusion-to-diffusion boundary. This design rule would typically require that source region 204 be wide enough to accommodate the source electrode contact as well as the extra lateral space required by the design rule. In the embodiment of FIG. 5, however, the extra lateral space between the source region contact edge and the leftmost edge of the source region is not provided because metal 217 extends over and contacts the upper surface of well region 207. Accordingly, the transistor structure is made smaller in the lateral dimension.

Similarly, polish stop structure 214 in the N-channel transistor 208 is coupled to source region 209 by metal 218. Transistor 208 is made smaller in the lateral dimension because the extra space typically required by design rules between the rightmost edge of the source contact and the source-to-well boundary to the right is not provided. Rather, metal 218 extends over and contacts the upper surface of well region 212 in this area.

Figure 6:
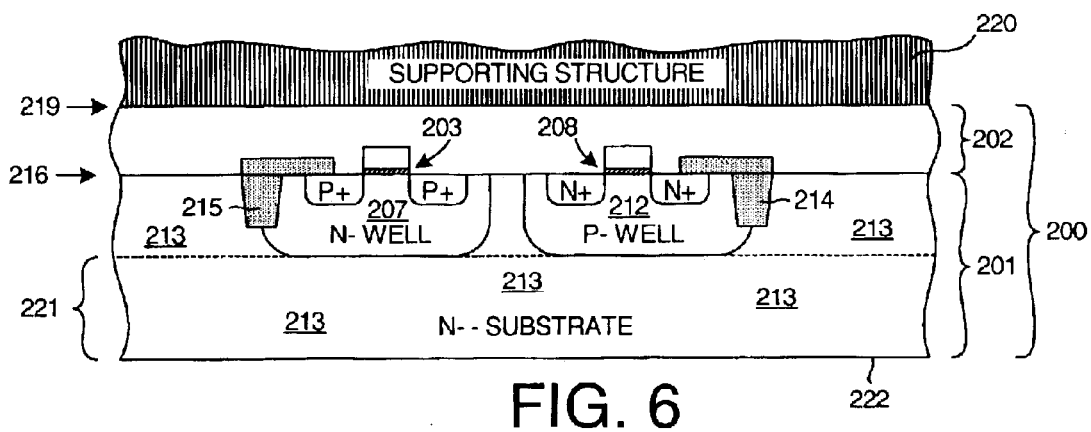
FIG. 6 is a simplified cross-sectional diagram of the device wafer of FIG. 5 after a supporting structure has been wafer-bonded to the face side surface of the device wafer in accordance with the second method.

FIG. 6 illustrates a subsequent step in the second method. Upper surface 219 of device wafer 200 is planarized and smoothed so that surface 219 is parallel with upper surface 216 of semiconductor wafer portion 201. A supporting structure 220 such as, for example, a silicon wafer is attached to upper surface 219 of device wafer 200. Supporting structure 220 may, for example, be covalently wafer-bonded to upper surface 219 of device wafer 200. A layer 221 of substrate region 213 is disposed between the bottom extent of well regions 207 and 212 and the back side surface 222 of device wafer 200.

Figure 7:
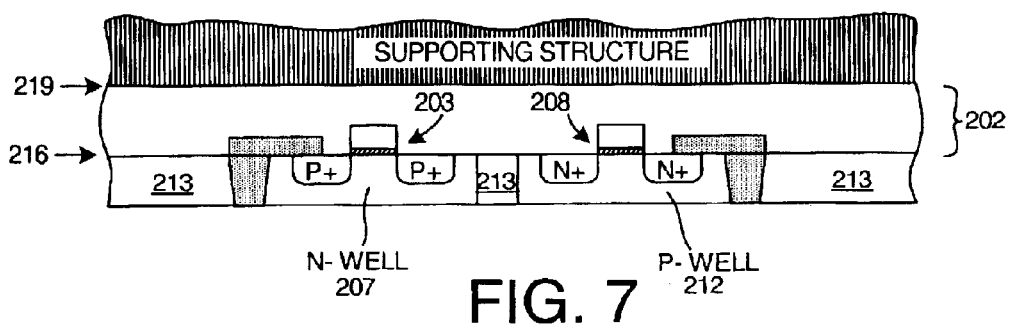
FIG. 7 is a simplified cross-sectional diagram of a subsequent step wherein the back side of the device wafer is thinned to remove a layer of substrate material and to expose a bottom portion of well regions in accordance with the second method.

FIG. 7 illustrates a subsequent step wherein device wafer 200 with the supporting structure 220 attached is thinned from its back side surface 222 until layer 221 is removed and until the polish stops 215 and 214 are reached. The result is that bottom portions of well regions 207 and 212 are exposed. Well regions 207 and 212 then appear as islands surrounded by substrate material 213 when device wafer 200 is viewed from the back side.

Figure 8:
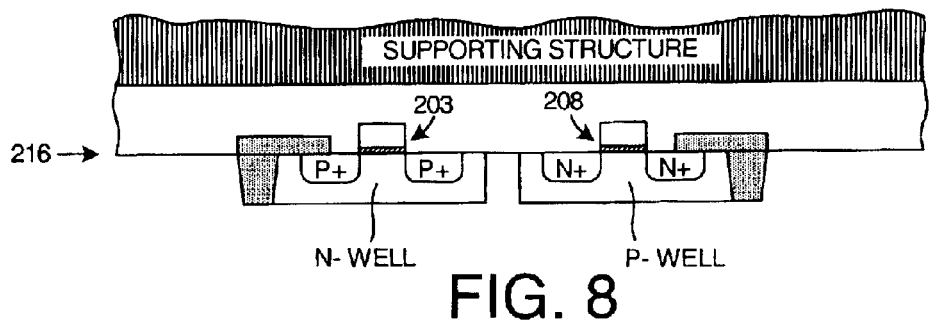
FIG. 8 is a simplified cross-sectional diagram of a subsequent step wherein all of the remaining substrate material is removed so that substantially no well-to-substrate junction capacitance remains in accordance with the second method.

FIG. 8 illustrates a subsequent step wherein the remaining portion of substrate region 213 is removed. To do this, the back side of device wafer 200 may be patterned with photoresist and etched such that substantially no substrate material of substrate region 213 remains in contact with either well region 207 or well region 212. Accordingly, there is substantially no well region to substrate capacitance in either of the transistors 203 or 208 because there remains no portion of the substrate material 213 in contact with a well region.

Figure 9:
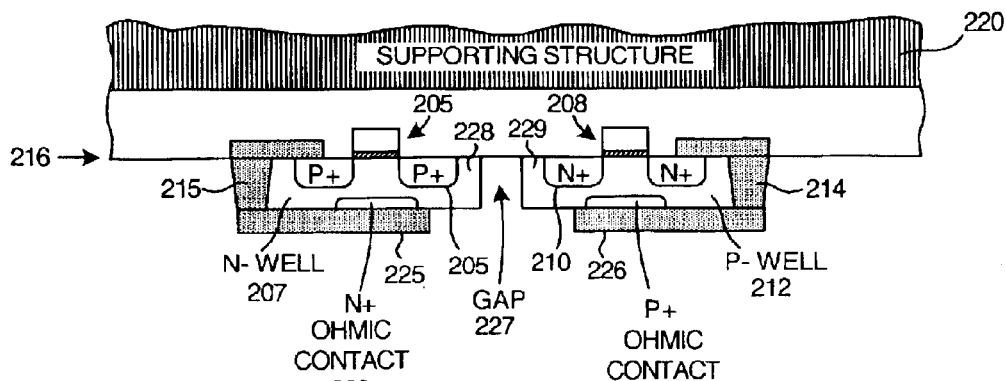
FIG. 9 is a simplified cross-sectional diagram of a subsequent step wherein well electrodes are placed on the exposed bottom surfaces of the well regions in accordance with the second method.

FIG. 9 illustrates a subsequent step wherein an N-type well ohmic contact region 223 is formed into the bottom exposed surface of well region 207 directly underneath the channel region of transistor 205. Well contact region 223 may, for example, be formed by ion implanting N-type dopants into the bottom exposed surface of well region 207. Similarly, a P-type well ohmic contact region 224 is formed on the bottom exposed surface of well region 212 directly underneath the channel region of transistor 208. Metal is then deposited over the back side surface of device wafer 200 and is patterned to form well electrodes 225 and 226. Well electrode 225 extends laterally from the bottom extent of polish stop 215 to make contact with the well contact region 223 directly underneath the channel region of transistor 205. Well electrode 226 extends laterally from the bottom extent of polish stop 214 to make contact with the well contact region 224 directly underneath the channel region of transistor 208.

Figure 10:
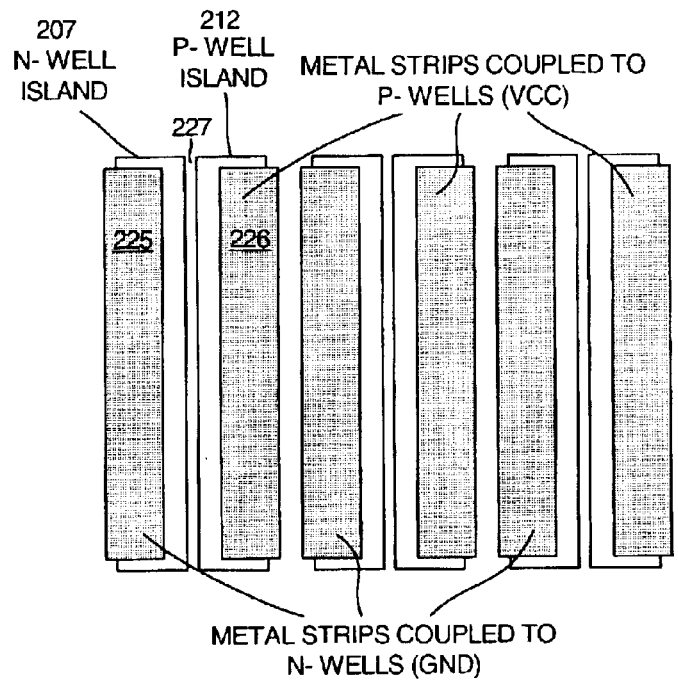
FIG. 10 is a simplified diagram of the back side of the device wafer showing columns of strip-shaped well electrodes in accordance with the second method.

FIG. 10 is a view of device wafer 200 when viewed from the back side. Alternating columns of P-channel transistors and N-channel transistors extend from left to right across the wafer. Current flow through each transistor extends from left to right. N-type well region 207 is a vertically oriented strip-like island. P-type well region 212 is a vertically oriented strip-like island. The gap 227 between the well regions 207 and 212 contains no semiconductor material. Gap 227 may, for example, be filled with air or an insulator such as silicon oxide or silicon nitride. By providing an air gap, source-to-drain punch-through immunity is improved.

The drains of the various P-channel and N-channel transistors can be coupled together by metal (not shown) to form logic elements or other circuit components. Because there remains no well-to-substrate junction capacitance in the transistors, the transistors do not suffer any lose in switching speed due to such a capacitance. Susceptibility to problems due to alpha particles is reduced because the reverse biased well-to-substrate junction is not present to separate electron and hole pairs.

Although the diagram of FIG. 9 shows there being a region 228 of well material disposed between drain region 205 and gap 227, and although the diagram of FIG. 9 shows there being a region 229 of well material disposed between drain region 210 and gap 227, these regions 228 and 229 need not be left remaining in the finished transistor structure. In one embodiment, gap 227 is made wider so that these regions 228 and 229 are etched away. The result is that the drain regions of transistors 205 and 208 have a reduced amount of drain-to-well junction. The parasitic drain-to-well capacitance of transistors 205 and 208 is therefore reduced.

Figure 11:
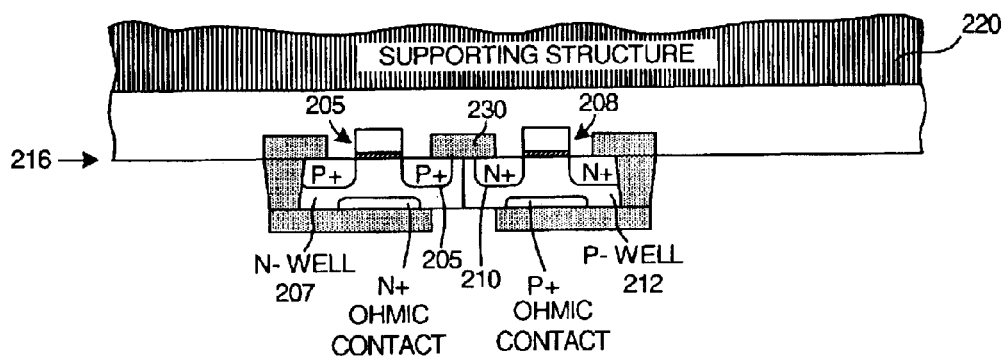
FIG. 11 is a simplified diagram of a structure wherein the well region of a P-channel transistor contacts the well region of an N-channel transistor in accordance with the second method.

FIG. 11 shows an alternative structure wherein N-type well 207 is made to contact P-type well 212 in the initial step of FIG. 5. The resulting transistor structure therefore has no gap 227 between the N-type well region 207 and the P-type well region 212, but rather the two well regions contact one another as illustrated in FIG. 11. Where the drains regions of transistors 203 and 208 are coupled together in the resulting integrated circuit, the drain regions 205 and 210 are coupled together with metal 230. Because the metal extends from drain region 205 and across the surface 216 of the semiconductor material to drain region 210, the space reserved between the metal to diffusion contact and the edge of the diffusion need not be provided in the area between the two drain regions 205 and 210. Drain regions 205 and 210 can therefore be placed closer together than design rules would otherwise permit. Closer component spacing is therefore possible without changing the critical dimension that can be achieved with the photolithographic process used.

Figure 12:
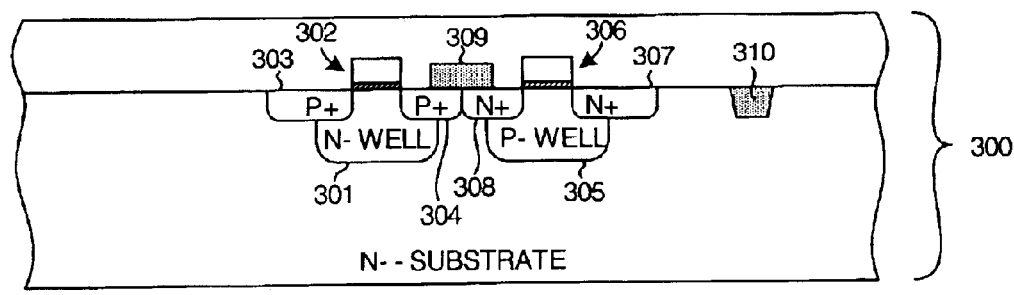
FIG. 12 is a simplified cross-sectional diagram of a device wafer in accordance with a step in a third method.

FIG. 12 is a simplified cross-sectional diagram of a device wafer 300 in an initial step of a third method. In the structure of FIG. 12, the N-type well region 301 of P-channel transistor 302 does not extend beyond the lateral boundary of the source and drain regions 303 and 304 in the dimension shown in FIG. 12. Similarly, the P-type well region 305 of N-channel transistor 306 does not extend beyond the lateral boundary of the source and drain regions 307 and 308 in the dimension shown in FIG. 12. The drain regions 304 and 308 are made smaller in the illustrated lateral dimension because space need not be reserved between the edge of the metal to drain region contact and the edge of the drain diffusion between the two transistors. As can be seen from the diagram of FIG. 12, the drain region 304 is smaller in the illustrated lateral dimension than is source region 303, and drain region 308 is smaller in the illustrated lateral dimension than source region 307. Metal 309 couples drain regions 304 and 308 together. A polish stop 310 is optionally provided. Polish stop 310 is slightly shallower than the depth of source and drain regions 303, 304, 307 and 308.

Figure 13:
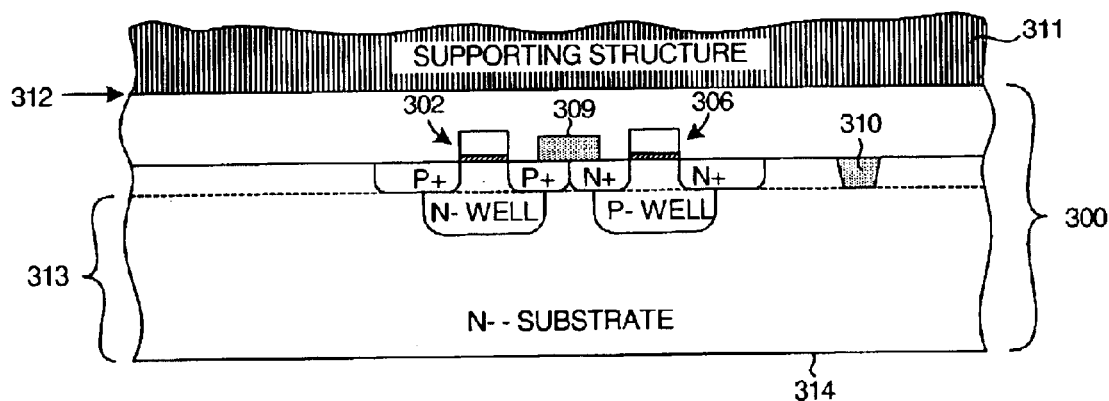
FIG. 13 is a simplified cross-sectional diagram of the device wafer of FIG. 12 after a supporting structure has been wafer-bonded to the face side surface of the device wafer in accordance with the third method.

FIG. 13 illustrates a subsequent step in the third method in which a supporting structure 311 is attached to the upper face side surface 312 of device wafer 300. A layer 313 of substrate semiconductor material exists between the bottom extent of the source and drain regions 303, 304, 307 and 308 and the back side surface 314 of device wafer 300.

Figure 14:
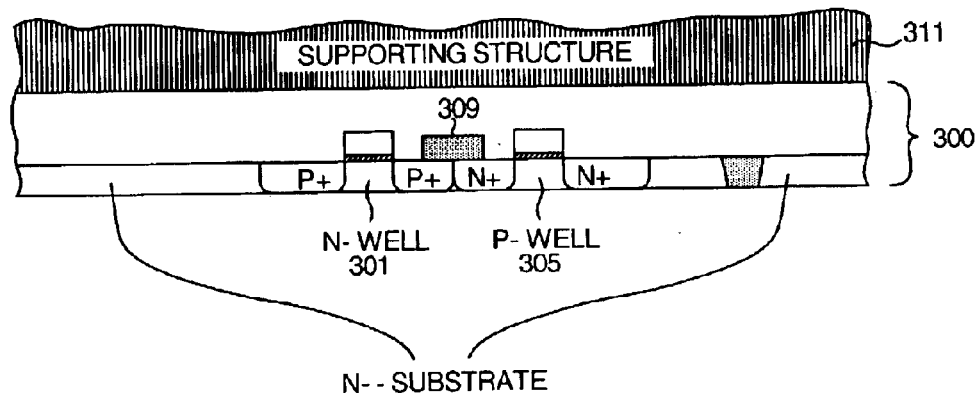
FIG. 14 is a simplified cross-sectional diagram of a subsequent step wherein the back side of the device wafer is thinned to remove a layer of substrate material and to expose a bottom portion of source and drain regions in accordance with the third method.

FIG. 14 illustrates a subsequent step wherein device wafer 300 is thinned to remove layer 313, thereby exposing the bottom portions of each of the sources and drains 303, 304, 307 and 308. A chemical mechanical polishing (CMP) thinning process may be employed to thin device wafer 300 from the back side until polish stop 310 is encountered. A light plasma etching may then be used to smooth the ground down back side surface after the CMP grinding step. FIG. 14 is a cross-sectional view of the resulting structure. All portions of well regions 301 and 305 that were disposed below the bottom extent of the source and drain regions of transistors 302 and 306 have been removed.

Figure 15:
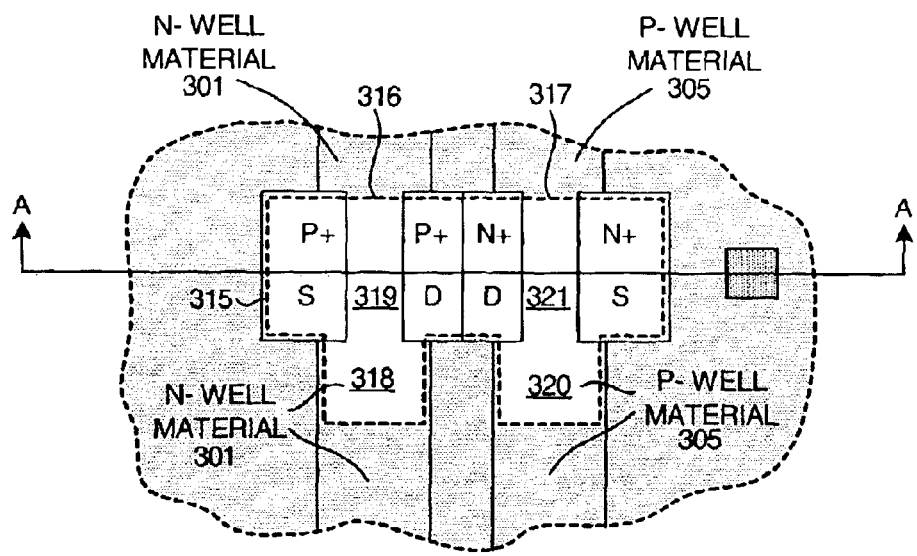
FIG. 15 is a diagram showing what areas of the transistor structure of FIG. 14 will be masked in a subsequent etching step in accordance with the third method.

FIG. 15 is a view of the back side of device wafer 300 that illustrates how a subsequent etching step is performed. Before the etching step, the source and drain regions of transistors 302 and 306 appear as rectangles when device wafer 300 is viewed from the back side. Well regions 301 and 305 appear as vertically oriented strips of semiconductor diffusion material. Dashed line 315 represents the outside boundary of a mask that covers the source and drain regions 303, 304, 307 and 308 as well as a contact portion 318 of N-well diffusion material and a contact portion 320 of P-well diffusion material.

After the masking step, an etching step is performed such that all semiconductor material in the darkened area located outside the mask boundary 315 is removed. The bottom of the interconnect portion 323 at surface 322 is exposed in the unmasked area. After this etching, the remaining portion of the strip 301 of N-well diffusion material has a key shape 316. This key shaped portion of N-well diffusion material includes a channel portion 319 and the contact region 318. Similarly, the remaining portion of the strip 305 of P-well diffusion material has a key shape 317. This key shaped portion of P-well diffusion material includes a channel portion 321 and the contact region 320.

Figure 16:
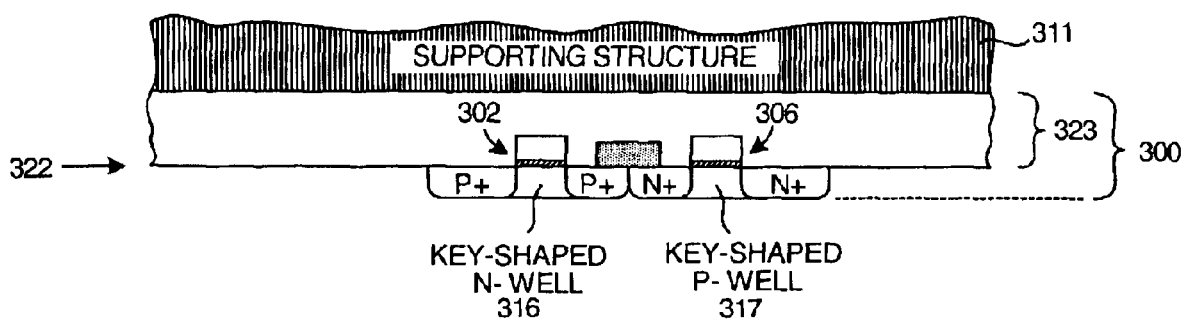
FIG. 16 is a simplified cross-sectional diagram of a subsequent step wherein substantially all of the semiconductor material is etched away but for the source region, the drain region, and a key-shaped channel region in accordance with third method.

FIG. 16 shows the resulting structure taken along sectional line A—A of FIG. 15.

Figures 17, 18:
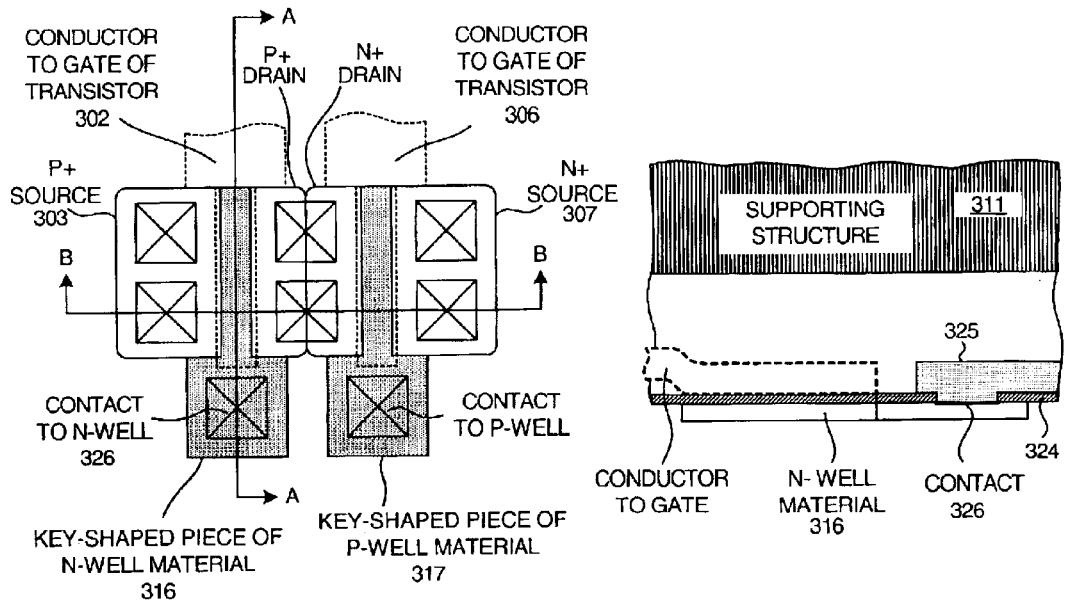
FIG. 17 is a simplified top-down diagram of the back side of the device wafer showing the resulting transistor structure in accordance with the third method.
FIG. 18 is a simplified cross-sectional diagram taken along sectional line A—A of FIG. 17.
Figure 19:
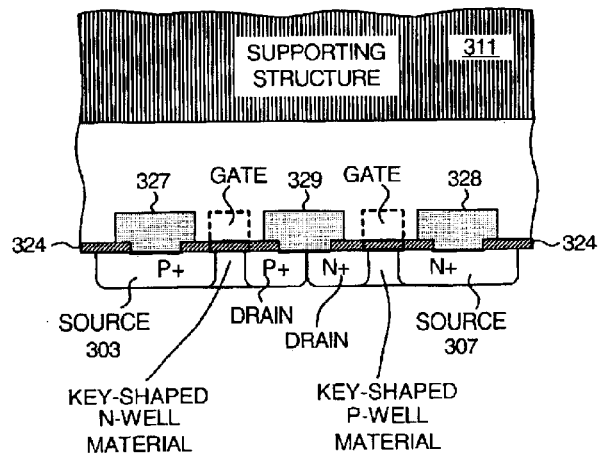
FIG. 19 is a simplified cross-sectional diagram taken along sectional line B—B of FIG. 17.

FIG. 17 is a more detailed top-down diagram of the structure of FIG. 16 when viewed from the back side of device wafer 300. FIG. 18 is a simplified cross-sectional diagram taken along sectional line A—A of FIG. 17. FIG. 19 is a simplified cross-sectional diagram taken along sectional line B—B of FIG. 17. In the diagrams of FIGS. 17–19, a square symbol with a cross drawn through it represents a contact area between a diffusion region and a layer above it. Layer 324 in FIGS. 18 and 19 is a thin layer of thermal oxide. The N-well of P-channel transistor 302 is biased by driving an appropriate voltage onto metal N-well electrode 325 (see FIG. 18). N-well electrode 325 makes ohmic contact with the key-shaped portion of N-well material 316 through contact 326. The same electrode and contact structure is provided for biasing the P-well of transistor 306. A source electrode 327 is shown in FIG. 19 making contact to source region 303 through a contact, and a source electrode 328 is shown making contact to source region 307 through a contact. A patch of metal 329 forms the drain electrodes for N-channel transistor 302 and for P-channel transistor 306.

The area of contact between well regions and the source and drain regions of transistors 302 and 306 is reduced in comparison with the area of contact in the transistor structure of FIGS. 9 and 11. Accordingly, the parasitic well-to-source and well-to-drain junction capacitance is reduced. Substantially the only well material in contact with a source or drain region is well material located in the channel region beneath the gate.

By eliminating the substrate material altogether, by reducing the size of the drain regions 304 and 308 as compared to the source regions, and/or by placing the well electrodes and associated contacts on the back side of the device wafer, less device wafer surface area is required to fabricate the transistors of the present invention as compared to the transistors of the conventional structure of FIG. 1. Closer component spacing is therefore achievable using the method of the present invention and this is possible without reducing the minimum feature size achievable with the semiconductor fabrication process used and without any advance in photolithographic techniques.

In the embodiment of FIG. 11, contact was made to the well regions by placing a metal electrode and contact on the back side of the device wafer directly underneath the gate. By placement of the contact on the back side of the well where there exists a relatively large exposed surface area of well material, contact is made close to the very narrow channel region directly underneath the gate. In the embodiment of FIGS. 17–19 where the well regions are ground away from the back side until the bottoms of the source and drain regions are reached, the exposed surface of well material remaining in the channel area is so narrow that making contact to the well material in that narrow area is difficult or impossible. Extending contact portions 318 and 320 of the key-shaped well regions are therefore provided in the embodiment of FIGS. 17–19 to make electrical contact with the relatively narrow channel portions of the well regions.

In one example of the structure of FIGS. 17–19, the gate has a length of approximately 0.2 microns (drawn length), the effective length of the gate is approximately 0.13 microns, the distance between the edge of the contact and the nearest diffusion boundary is approximately 0.15 microns, the width of a contact is 0.15 microns, the width of the metal (for example, the well electrode) in the area of the contact where the metal passes over the contact area is 0.25 microns, and the distance between the edge of the source or drain electrode and the closest edge of the gate electrode is approximately 0.2 microns. The gate is a polysilicon gate structure, whereas the source and drain electrodes are 0.25 micron wide traces of metal.

Figure 20:
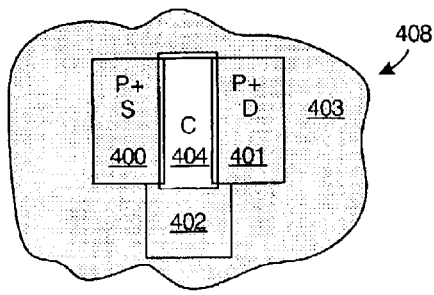
FIG. 20 is a simplified top-down diagram of the back side of the device wafer showing which area will be etched in order to thin the channel region in a step in accordance with a fourth method.

FIG. 20 is a view of a transistor structure partway through the process of fabricating a double gate transistor in accordance with a fourth method. FIG. 20 is a top-down view of the back side of a device wafer 408 where all the semiconductor material has been removed but for source and drain P-type regions 400 and 401 and an intervening key-shaped portion of N-type well material 402. The process used to reach the process stage in FIG. 20 is the same as described above in connection with the embodiment of FIGS. 17–19, except that a single isolated P-channel transistor structure is illustrated in the example of FIG. 20. The P-channel transistor of FIG. 20 appears in cross-section similar to the transistors of 17–19. In FIG. 20, the darkened area represents a mask 403 used to mask the entire transistor structure but for the rectangular channel region 404 of N-type well material between the source and drain regions. In this case the contact portion of key-shaped portion 402 is masked.

Channel region 404 is then etched from the back side of device wafer 408 thereby thinning the narrow rectangular channel region 404 of N-type well material between the source and drain regions.

After the thinning of channel region 404, a thin oxide layer 404 is formed on the bottom exposed surface of source region 400, drain region 401 and the key-shaped well region 402. This thin oxide layer 404 serves as a gate insulator for a second gate. A contact area 410 for a second gate is formed by removing a portion of the thin oxide layer underneath gate electrode 411. A metal layer is then deposited on the back side surface of the structure and is patterned to form a second gate electrode 405.

Figure 21:
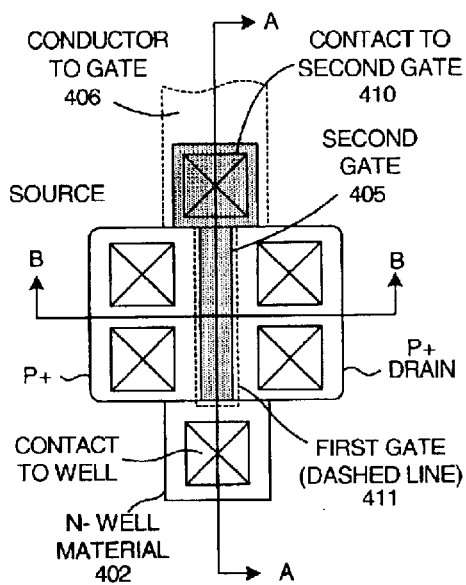
FIG. 21 is a simplified top-down diagram of the back side of the device wafer showing the resulting double gate transistor structure having a thinned channel region in accordance with the fourth method.
Figure 22:
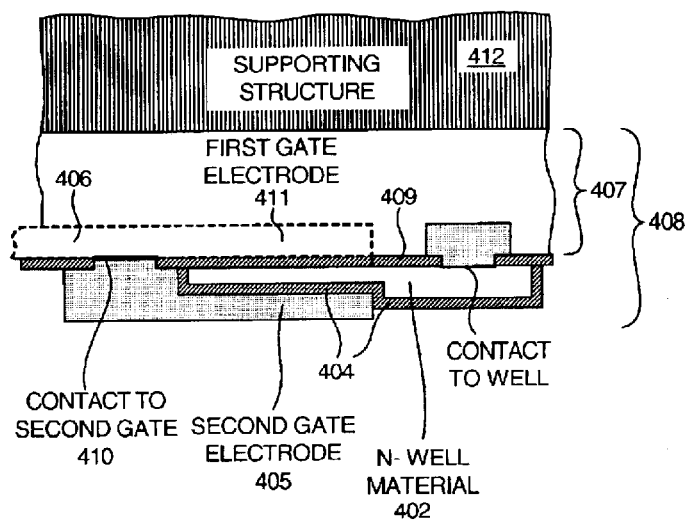
FIG. 22 is a simplified cross-sectional diagram taken along sectional line A—A of FIG. 21.
Figure 23:
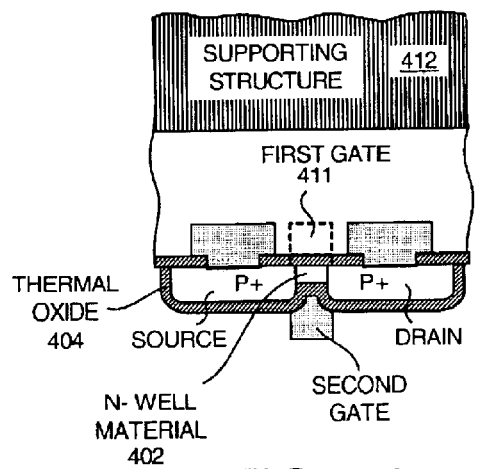
FIG. 23 is a simplified cross-sectional diagram taken along sectional line B—B of FIG. 22.

FIG. 21 is a view of the resulting transistor structure viewed from the back side of device wafer 408. FIG. 22 is a cross-sectional diagram of the structure taken along sectional line A—A of FIG. 21. FIG. 23 is a cross-sectional diagram of the structure taken along sectional line B—B of FIG. 21.

As seen in FIGS. 21 and 22, a conductor 406 within the interconnect portion 407 of device wafer 408 extends across the gate insulator 409 and becomes the first gate electrode 411 of the upper (first) transistor. The metal of the second gate electrode 405 establishes electrical contact with metal conductor 406 up through contact area 410. As indicated by the darkened area in FIG. 21, the metal of second gate 405 has a key-shape when viewed from the back side of device wafer 408. The metal of the upper (first) gate electrode and the metal of the second gate electrode therefore sandwich the intervening narrow channel portion of N-type well material 402. As shown in FIG. 21, the N-type well material has a key-shape when viewed from the back side of the device wafer 408. In the diagram of FIG. 21, the narrow channel portion of the key-shaped N-type well region 402 points upward whereas the narrow portion of the key-shaped second metal gate electrode 405 extends downward. After fabrication of the double gate transistor structure, the composite wafer structure involving the supporting structure 412 and the thinned device wafer 408 is diced into individual integrated circuit dice.

In operation, when the threshold voltage of the transistor of FIGS. 21–23 is reached, the upper first gate electrode induces a first conductive channel to form on the upper surface of N-type well material 402 between source region 400 and drain region 401. Second gate electrode 405 also induces a second conductive channel to form on the lower surface of N-type well material 402 between source region 400 and drain region 401. Second gate electrode 405 may also, if the channel region is sufficiently thin, enhance conductivity of the first conductive channel.

Providing second gate 405 in the transistor structure of FIGS. 21–23 has certain advantages. The threshold voltage of the double gate structure can be adjusted such that less leakage current flows through one of the channels between the source and the drain when a zero gate to source voltage is present than would be the case in a single gate structure of similar construction. The result is a reduction in the amount of current flow between the source and drain when the transistor is on. In the double gate structure of FIGS. 21–23, the second gate causes a second conductive channel to form along with the first channel when the transistor is turned on. The second gate also enhances conductivity of the first channel. The current that flows through the second channel compensates at least to some degree for the reduction in the source drain current in the first channel caused by the threshold voltage adjustment. Accordingly, the threshold voltage of the double gate transistor is adjusted to reduce leakage when the transistor is off at a particular subthreshold voltage without the transistor having a reduced source-to-drain current flow for a particular gate-to-source voltage when the transistor is turned on and operating above the threshold voltage.

Although certain specific exemplary embodiments are described above in order to illustrate the invention, the invention is not limited to the specific embodiments. Certain specific transistor structures are set forth above as illustrations of transistor structures that can be made in accordance with the new bond and back side etchback process described above. These transistor structures are, however, not the only transistor structures that can be realized using the new process. Numerous configurations of transistors and contacts and electrodes are possible. In addition to field effect transistors, bipolar transistors can be fabricated using the bond and back side etchback process. Many device structures made using an epitaxial silicon processing technology can be made using the above-described bond and back side etchback process. Rather than being made out of epitaxial silicon, however, these structures are made out of higher quality bulk silicon substrate material by bonding a supporting structure to the face side of a processed device wafer and then grinding away the back side of the device wafer and then processing the thinned device wafer from the back side.

In one embodiment, islands of semiconductor material on the back side of the device wafer are cooled by directing a flow of air or other heat removing gas or fluid across the islands and/or directly onto the source and drain regions of the transistors. The supporting structure bonded to the device wafer may be a structure other than a handle wafer of silicon. In one example, the supporting structure is a piece of metal (for example, copper) that has a tunnel running though it in the lateral dimension parallel with the upper surface of the device wafer. Cooling fluid can be circulated through the tunnel in the metal so that the fluid withdraws heat from the supporting structure. Heat is withdrawn from the device wafer via the cooled metal supporting structure. In one embodiment, a layer of an insulating and passivating material is deposited over the entire back side surface of the device wafer after the transistors structures described above have been fabricated. Accordingly, various modifications, adaptations, and combinations of various features of the described embodiments can be practiced without departing from the scope of the invention as set forth in the following claims.

What is claimed is:

1. A method, comprising:
   (a) attaching a supporting structure to a face side of a device wafer, a transistor being disposed on the face side of the device wafer, the transistor comprising a gate, a source region of a first conductivity type and a drain region of the first conductivity type, the source and drain regions extending into a well region of a second conductivity type opposite the first conductivity type, the device wafer also having a planar back side surface, a layer of the device wafer being disposed between the source and drain regions and the back side surface of the device wafer;
   (b) processing the back side surface and thereby removing the layer of the device wafer such that a portion of the well region is exposed; and
   (c) forming a well electrode that is electrically coupled to the well region so that the well electrode is disposed directly underneath the gate.

2. The method of claim 1, wherein the well electrode is formed in step (c) by depositing a metal on the exposed portion of the well region such that the metal of the well electrode is at least partly disposed directly underneath the gate.

3. The method of claim 1, wherein the well electrode is formed in step (c) by doping a surface region of the exposed portion of the well region and then depositing a metal on the doped surface region such that the metal is disposed directly underneath the gate.

4. The method of claim 1, wherein the removing of the layer in (b) is performed at least in part by chemical mechanical polishing.

5. The method of claim 1, wherein the removing of the layer in (b) results in the device wafer having a planar exposed back side surface, the exposed portion of the well region being a part of the planar exposed back side surface.

6. The method of claim 1, wherein a second transistor is disposed on the face side of the device wafer, the second transistor comprising a gate, a source region and a drain region, wherein prior to the processing of (b) a portion of the device wafer is disposed between the first transistor and the second transistor, the method further comprising:

removing the portion of the device wafer between the first transistor and the second transistor such that the first transistor is separated from the second transistor by an air gap.

7. The method of claim 1, wherein the well region extends into a semiconductor region of the first conductivity type, the method further comprising:

after (b) and before (c) removing an additional amount of the device wafer such that there remains no portion of the semiconductor region of the first conductivity type in contact with the well region.

8. The method of claim 7, wherein substantially all of the semiconductor region of the first conductivity type is removed prior to step (c).

9. The method of claim 1, wherein after step (c) the supporting structure remains attached to the face side of the device wafer such that the supporting structure and the device wafer together are a supporting structure/device wafer assembly, the method further comprising:

(d) cutting the supporting structure/device wafer assembly into integrated circuit dice.

10. The method of claim 1, wherein the device wafer further comprises a source electrode that is coupled to the source region, and wherein after step (c) the well electrode is coupled to the source electrode by a metal structure.

11. The method of claim 1, wherein prior to step (a) the device wafer comprises a polish stop structure, and wherein step (b) involves using the polish stop structure to determine when to stop thinning the device wafer.

12. The method of claim 1, wherein the device wafer comprises a plurality of transistor structures, each of the transistor structures having a source region and a drain region disposed in the well region, each of the transistors also having a gate, and wherein the well electrode extends directly under the gate of each of the transistors and makes electrical contact with the well region directly underneath the gate of each of the transistors.

13. The method of claim 1, wherein the well region forms a junction with no semiconductor material of the first conductivity type other than with the source region and with the drain region.

14. The method of claim 1, wherein the transistor is a first transistor, and wherein device wafer further comprises a second transistor, the second transistor having a source region of the second conductivity type and a drain region of the second conductivity type, the source and drain regions of the second transistor extending into a well region of the first conductivity type, wherein the well region of the first transistor contacts the well region of the second transistor.

* * * * *